US007064008B2

(12) United States Patent
Abbott et al.

(10) Patent No.: US 7,064,008 B2
(45) Date of Patent: Jun. 20, 2006

(54) SEMICONDUCTOR LEADFRAMES PLATED WITH THICK NICKEL, MINIMUM PALLADIUM, AND PURE TIN

(75) Inventors: Donald C. Abbott, Chartley, MA (US); Douglas W. Romm, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 10/762,122

(22) Filed: Jan. 20, 2004

(65) Prior Publication Data

US 2004/0183165 A1    Sep. 23, 2004

Related U.S. Application Data

(63) Continuation of application No. 10/061,823, filed on Feb. 1, 2002, now Pat. No. 6,713,852.

(51) Int. Cl.
*H01L 21/50* (2006.01)

(52) U.S. Cl. ........................ 438/111; 438/123

(58) Field of Classification Search ................ 438/106, 438/111, 121, 123, 110
See application file for complete search history.

(56) References Cited

U.S. PATENT DOCUMENTS

| | | | | |
|---|---|---|---|---|
| 4,707,724 A | * | 11/1987 | Suzuki et al. | 257/677 |
| 5,424,578 A | * | 6/1995 | Fujita et al. | 257/677 |
| 5,540,378 A | * | 7/1996 | Mahulikar et al. | 228/180.21 |
| 5,635,755 A | * | 6/1997 | Kinghorn | 257/666 |
| 5,882,955 A | * | 3/1999 | Huang et al. | 438/111 |
| 6,376,901 B1 | | 4/2002 | Abbott | 257/666 |
| 6,545,344 B1 | * | 4/2003 | Abbott | 257/666 |
| 6,706,561 B1 | * | 3/2004 | Abbott | 438/123 |
| 2002/0047186 A1 | | 4/2002 | Tellkamp et al. | |
| 2002/0070434 A1 | * | 6/2002 | Abbott et al. | 257/677 |
| 2002/0144396 A1 | | 10/2002 | Glenn | |
| 2002/0148630 A1 | | 10/2002 | Glenn | |
| 2004/0155321 A1 | * | 8/2004 | Abbott | 257/666 |

FOREIGN PATENT DOCUMENTS

JP    359161850 A  * 12/1984

OTHER PUBLICATIONS

Suzuki et al. (English Language Abstract), Sep. 12, 1984, pp. 1-2.*
Zarlink Semiconductor, Zarlink Pb-Free/RoHS Strategy, pp. 1-2.*
"Semiconductor Leadframes Comprising Silver Plating" Tellkamp, U.S. Patent Publication No. US 2002/0047186 A1 Published Apr. 25, 2002, filed Jul. 17, 2001.

* cited by examiner

*Primary Examiner*—Scott Geyer
(74) *Attorney, Agent, or Firm*—Yingsheng Tuna; Wade James Brady, III; Frederick J. Telecky, Jr.

(57) ABSTRACT

A leadframe for use with integrated circuit chips comprising a base metal having a plated layer of nickel fully covering the base metal; a plated layer of pure tin on the nickel layer, selectively covering areas of the leadframe intended for attachment to other parts; and a plated layer of palladium on said nickel layer, selectively covering areas of said Leadframe intended for bonding wire attachment.

8 Claims, 4 Drawing Sheets

SEMICONDUCTOR LEADFRAMES PLATED WITH THICK NICKEL, MINIMUM PALLADIUM, AND PURE TIN

This application is a continuation of application Ser. No. 10/061,823 filed Feb. 1, 2002 now U.S. Pat. No. 6,713,852.

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 μm) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent # 0 335 608 B1, issued 14 Jun. 1995 (Abbott, "Leadframe with Reduced Corrosion"), U.S. Pat. No. 6,194,777, issued 27 Feb. 2001 (Abbott, "Leadframes with Selective Palladium Plating"), and U.S. Pat. No. 6,246,446, issued 12 Jun. 2001 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Nickel/palladium plated leadframes are used because of their low total cost of ownership, primarily a result of eliminating post-mold solder plating. However, some customers, for instance automotive manufacturers and telephone central switching offices, require solder plated external leads, typically because of burn-in, accelerated testing or environmental conditions.

If solder dipping is used after molding, the palladium will dissolve into the solder and the nickel is then solderable. However, solder dipping is not practical for devices with fine-pitch leadframes because of solder bridging. The typical solution to this dilemma is to use a silver spot-plated leadframe with post mold solder plating. In this process, solder is plated on the external leads which are either copper or nickel-plated copper. With small package geometries, there are tolerance limits with silver spot plating.

The price of palladium climbed in the last decade to approximately twice the gold price. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability.

In U.S. patent applications Ser. No. 60/138,070, filed on 8 Jun. 1999 (Abbott, "Palladium-Spot Leadframes for Solder Plated Semiconductor Devices and Method of Fabrication"), and Ser. No. 60/214,314, filed on 27 Jun. 2000 (Abbott, "Semiconductor Leadframes Plated with Lead-Free Solder and Minimum Palladium"), to which the present invention is related, a fabrication process for palladium layers of reduced thickness is described. There is, however, a problem for pre-plated leadframes in the selection of a tin-based solder without the risk of tin dendrite growth.

An urgent need has therefore arisen for a low-cost, reliable mass production method for a leadframe combining the advantages of palladium with its bondability and adhesion capability to molding compounds, and the application of pre-plated lead-free solders. The palladium layer should have reduced thickness. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, a base metal having a plated layer of nickel fully covering the base metal has a plated layer of pure tin solder on the nickel layer selectively covering areas of the leadframe intended for attachment to other parts. Further, a plated layer of palladium on the nickel layer selectively covers areas of the leadframe intended for bonding wire attachment.

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, digital and analog devices, and both large and small area chip categories. The invention represents a significant cost reduction and enhances environmental protection and assembly flexibility of semiconductor packages, especially the plastic molded packages, compared to the conventional copper-based solder-plated leadframes.

It is an aspect of the present invention to provide a technology for enabling solder package leads with pre-plated pure tin solder, while maintaining a palladium layer in the localized areas intended for wire bonding with its significant cost advantage over the traditional silver spot plated inner leads.

Another aspect of the invention is to provide the tin solder as a matte, coarse grain, low carbon content deposit of relatively high thickness (about 4 to 6 µm). The tin annealing is a by-product of the molding compound curing after encapsulation. Tin whiskers on the outside of the package are suppressed by the nickel.

Another aspect of the invention is to reach these goals with a low-cost manufacturing method without the cost of equipment changes and new capital investment, by using the installed fabrication equipment base.

Another aspect of the invention is to produce leadframes so that established wire bonding processes can continue unchanged, and that established board attachment process can continue unchanged.

Another aspect of the invention is to eliminate silver and the cyanide solution used for its deposition from the leadframe manufacturing process flow, resulting in less costly waste treatment.

Another aspect of the invention is to introduce a palladium spot plating technology, which provides loose tolerance for the spot boundaries, thus simplifying leadframe manufacturing and lowering fabrication cost.

These aspects have been achieved by the teachings of the invention concerning deposition and masking methods suitable for mass production. Various modifications of leadframe preparations have been successfully employed.

In the preferred embodiment of the invention, a plated layer of nickel is fully covering the leadframe base material. A plated layer of pure tin solder is plated onto the nickel layer so that it covers selectively leadframe areas intended for parts attachment, especially board assembly. A layer of palladium is then plated onto the nickel layer so that it covers selectively the leadframe areas intended for bonding wire attachment.

Leadframes prepared according to the invention can be successfully used in surface mount technologies based on bending the package lead segments.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
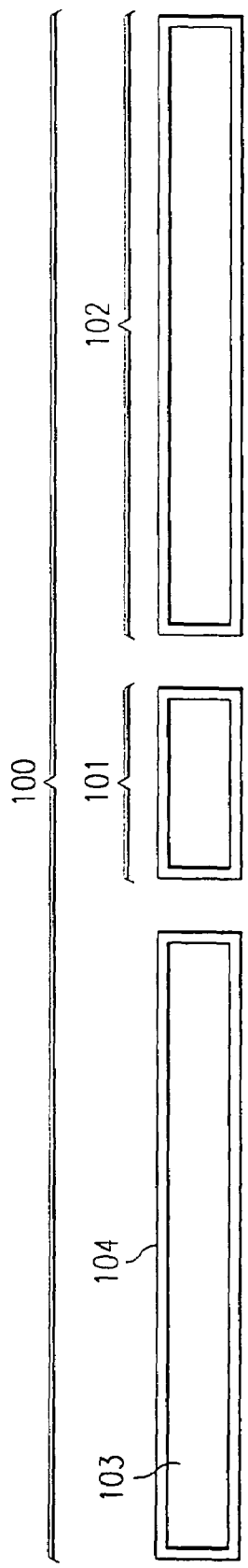
FIG. 1 is a schematic and simplified cross sectional view of a leadframe with base metal and first plated layer.

The present invention is related to U.S. patent application Ser. No. 60/214,314, filed on 27 Jun. 2000 (Abbott, "Semiconductor Leadframes Plated with Lead-free Solder and Minimum Palladium"), which is herewith incorporated by reference. The present invention is further related to U.S. patent application No. 60/138,070, filed on 8 Jun. 1999 (Abbott, "Palladium-Spot Leadframes for Solder Plated Semiconductor Devices and Method of Fabrication").

The present invention is related to the composition and sequential construction of semiconductor leadframes and to the assembly of semiconductor chips on leadframes. This assembly includes wire bonding interconnection, chip encapsulation, and the environmentally friendly process of reliable attachment of the devices to substrates using lead-free solder.

The invention reduces the cost of leadframes while the leadframe functions are maximized. The invention best applies to any leadframe and any substrate used in semiconductor technology which exhibit the following design features: Usually, a chip mount pad for support of the IC chip surrounded by lead segments, each having a first end in proximity of the chip pad, and a second end remote from the chip pad. The invention thus applies to semiconductor package types such as PDIPs, SOICs, QFPs, SSOPs, TQFPs, TSSOPs and TVSOPs.

As defined herein, the starting material of the leadframe is called the "base metal", indicating the type of metal. Consequently, the term "base metal" is not to be construed in an electrochemical sense (as in opposition to 'noble metal') or in a structural sense. The base metal of leadframes is typically copper or copper alloys. Other choices comprise brass, aluminum, iron-nickel alloys ("Alloy 42"), and invar.

Leadframe segments have to satisfy five needs in semiconductor assembly:

1) Leadframes have to comprise segment ends remote from the chip mount pad ("outer segments") for solder attachment to other parts;
2) leadframes have to comprise segment ends near the chip mount pad ("inner segments") for bond attachments to wire interconnections;
3) leadframes have to comprise outer segments ductile for forming and bending the segments;
4) leadframe surfaces have to comprise adhesion to molding compounds; and
5) leadframe segments have to comprise insensitivity to corrosion.

According to the teachings of this invention, Need 1) is satisfied by depositing a layer of nickel, fully covering the leadframe base metal, and then selectively preplating a layer of pure tin onto the nickel layer only onto those leadframe areas which are intended for parts attachment.

The invention satisfies Need 2) by first plating the nickel layer, fully covering the leadframe base metal as outlined above, and then plating a thin layer of palladium (or, if desired, of silver) onto the nickel layer, selectively covering areas of the leadframe which are intended for bonding wire attachment (and chip attachment). For palladium, a thin layer is sufficient for reliable bonding wire attachment (stitch bonds, ball bonds, or wedge bonds).

The invention satisfies Need 3) by the selection of thickness and structure of the nickel layer employed to fulfill need 1). Thickness and deposition method of the nickel layer have to be selected such that the layer insures ductility and enables the bending and forming of the outer lead segments.

The invention satisfies Need 4) by the choice of the noble metal layer employed to fulfill need 2); a practical selection is palladium with its excellent adhesion to thermoset molding compounds and other encapsulation materials.

The invention satisfies Need 5) by the sequence of layers deposited over the copper base: Nickel and pure tin.

FIG. 1 is a schematic and simplified cross section of a leadframe portion, generally designated 100, and shows the chip mount pad 101 and a plurality of lead segments 102. The leadframe is made of a base metal 103 fully covered with a plated layer 104. The base metal usually is copper or copper alloy, but may also be aluminum, brass, an iron-nickel alloy, or invar. The copper or copper alloy base sheet 103 has a preferred thickness in the range from 100 to 300 µm; thinner sheets are possible. The ductility in this thickness range provides the 5 to 15% elongation needed in the segment bending and forming operation. The leadframe is stamped or etched from the starting metal sheet. The plated nickel layer has a preferred thickness is the range from about 0.2 to 3.0 µm.

In the plating process, the stamped or etched leadframe is first immersed in an alkaline preclean solution at 20 to 90° C. for few seconds up to 3 minutes. Both alkaline soak cleaning and alkaline electrocleaning are employed. Oils, grease, soil, dirt and other contamination are thereby removed.

After rinsing, the leadframe is next immersed in an acid activation bath at room temperature for few seconds up to 5 minutes. The bath consists of a solution of sulfuric acid, hydrochloric acid, or other acid solution, preferably at about 30 to 60 g/l concentration. This solution removes copper oxide and leaves the metallic copper oxide surface in an activated state, ready to accept the deposition of metallic nickel.

Next, the leadframe is immersed in a first nickel plating solution to receive the deposition onto the copper base material of a nickel strike in the thickness range of about 0.02 to 0.13 µm. This first nickel layer fully encases the copper base metal and thus keeps the subsequent main nickel bath free from copper and copper compounds.

Next, the leadframe is immersed in a second nickel plating solution to receive the deposition onto the first nickel layer of an additional nickel layer in the thickness range of about 0.45 to 2.0 µm. The total thickness range of layer 104 is approximately 0.5 to 3.0 µm. This nickel layer has to be ductile for the leadframe segment bending and forming process. Further, the nickel surface has to be wettable in the soldering process, so that solder alloys or conductive adhesives can be used successfully.

Figure 2:
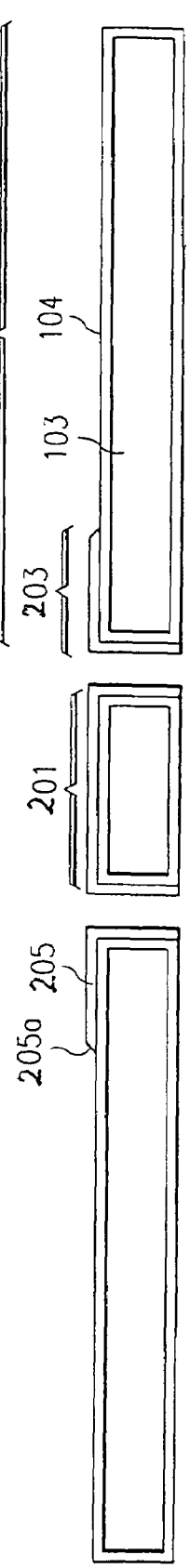
FIG. 2 is a schematic and simplified cross sectional view of a leadframe after the plating step for wire bonding enhancement according to the invention.

The schematic cross section of a leadframe in FIG. 2 depicts the thin palladium layer 205, plated on the area of chip pad 201 and the first ends 203 of segment 202 near the chip pad. The deposited layer 205 comprises an electroplated palladium layer in the thickness range of about 20 to 60 nm. Another choice as noble metal would be silver or rhodium. The palladium thickness could possibly reduced to about 10 and 30 nm. The area portion 203 of the plurality of lead segments is determined by the technical requirement of the intended wire bonding attachment. In the schematic example of FIG. 2, layer 205 terminates at boundary 205a. It is an advantage of the invention that boundary 205a may have loose tolerances.

In this thickness range, palladium is suitable for all wire bonding attachments (stitch bonds, ball bonds, and wedge bonds) and retains its excellent adhesion to thermoplastic molding compounds—an attribute crucial for avoiding package delamination and progressive corrosion. It should further be noted that the surface of the leadframe that is not spot-plated with palladium has on the order of 1 to 5 nm of palladium on it. Consequently, the surface has some nickel and some palladium character to it. After the thermal excursions of the device assembly process, the surface should have an adherent layer of nickel oxide that can provide superior molding compound adhesion.

Figure 3:
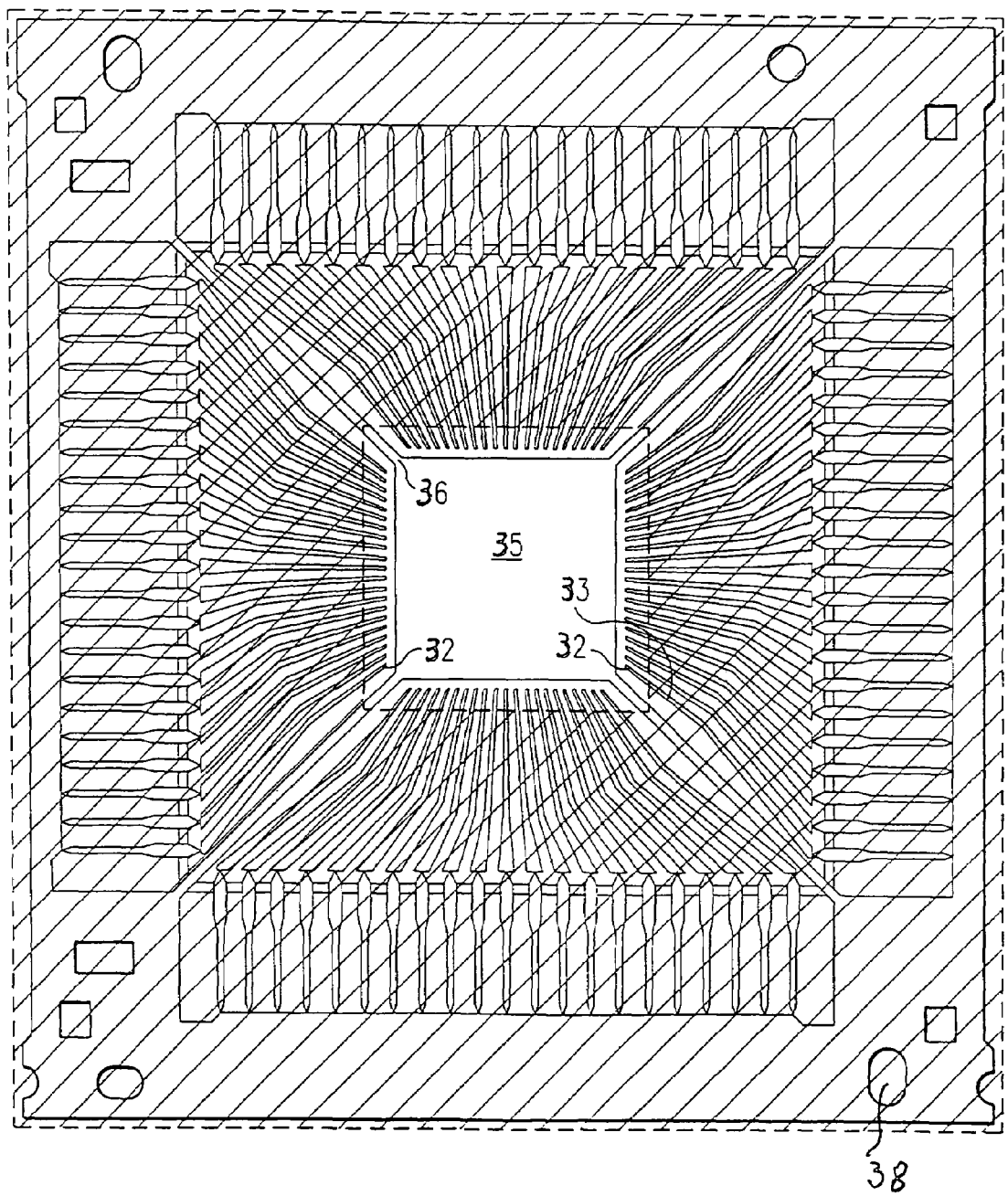
FIG. 3 is a simplified top view of an example of a leadframe unit for semiconductor devices, delineating the masking needed in the plating fabrication method for wire bonding enhancement according to the invention.

It is an important aspect of the present invention to deposit the palladium layer selectively onto the leadframe by using an inexpensive masking step. The selective characteristic of the palladium deposition is achieved by a temporary masking step, which leaves only those leadframe portions exposed which are intended to receive the palladium layer. An example of the extent of such masking is depicted in FIG. 3, which shows a single leadframe unit from a continuous strip, for a typical semiconductor Quad Flat Pak device. The temporarily masked parts of the leadframe unit are shaded and the exposed parts are unshaded. The exposed parts include the first ends 32 of the plurality of leadframe leads 33, the chip pad 35, and the portions 36 of the support members of the chip pad. These first ends are positioned near chip pad 35. In FIG. 3, the first ends 32 surround the periphery of chip pad 35, but are separated from the pad by the gap which will be bridged by the bonding wires.

There are several methods to selectively deposit metals from solution onto a continuous strip. For high volume production of leadframes, continuous strip or reel-to-reel plating is advantageous and common practice. Based on the loose tolerance acceptable for the boundaries of the palladium plating on the inner ends of the lead segments, the preferred deposition method for the present invention is the so-called "wheel system". The process steps are as follows.

Wheel System
- Material is moved over a large diameter wheel with apertures in it to allow solution flow to material;
- apertures define the locations for plating; index pins engage the pilot holes (designated 38 in FIG. 3) in the leadframe;
- backing belt is used to hold material on wheel and mask backside of material;
- anode is stationary inside wheel.

Advantages: Fast, material never stops for selective plating; no timing issues; pumps, rectifiers, and drive system are on continuously; low cost because system is mechanically uncomplicated.

Disadvantages: Loose plating boundaries, poor spot location, and potential bleedout are not critical issues for the present invention.

A more precise, but also more costly and slower selective plating technique is the step-and-repeat process.

Step and Repeat

Leadframe material is stopped in selective plating head;
rubber mask system clamps on material;
plating solution is jetted at material;
current is applied;
current is shut off;
solution is shut off;
head opens;
material moves.

Advantages: Very sharp plating spot with excellent edge definition; very good spot location capability when used with index holes, pins and feedback vision system.

Disadvantages: Slow; material must stop during selective plating; expensive equipment to buy and maintain; timing issues; lots of moving parts.

Figure 4:
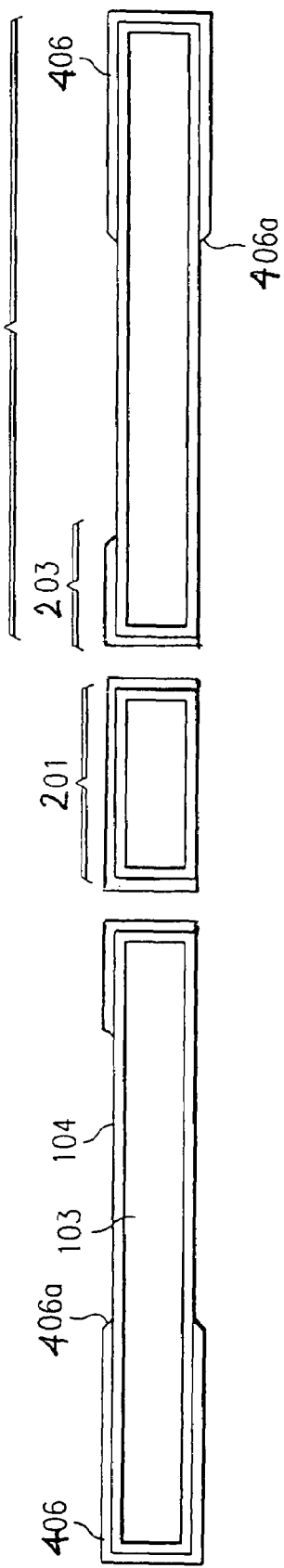
FIG. 4 is a schematic and simplified cross sectional view of a leadframe after the plating step for pure tin solder according to the invention.

The schematic cross section of a leadframe in FIG. 4 depicts a relatively thick pure tin solder layer 406, which is plated selectively onto the flood plated layer 104 of nickel over the leadframe base material 103. The tin layer has a thickness in the range from about 4.0 to 6.0 µm. The tin plated portions cover the areas of the leadframe intended for board attach or other parts attachment, specifically the second ends of the lead segments 402, remote from the chip mount pad. The boundary of the solder plated portion is designated 406a in FIG. 4. It is an advantage of the invention that boundary 406a may have loose tolerances.

It is of pivotal importance to the present invention that
  the solder is lead-free;
  the solder is deposited as a pre-plated layer, i.e., applied
    to the leadframe before the start of chip assembly;
  the solder has the reflow temperature of tin (232° C.) so
    that IC assembly temperatures up to about 215° C. are
    tolerable, including wire bonding and package molding;
  the solder is able to dissolve into the solder flux or wave
    during device board attach, and
  the solder avoids tin whisker growth.

It is helpful for suppressing whisker growth that the pre-plated tin layer is in a matte, coarse grain, and low carbon content composition. Most important is the fact that the tin layer receives, due to its pre-plating deposition before the molding encapsulation process, a thorough annealing step during the extended molding compound polymerization period ("curing"; commonly at 175° C. for 5 to 6 hr). It is a technical advantage of the invention that this pivotal annealing step is provided without any additional time or cost during the assembly process.

Figure 5:
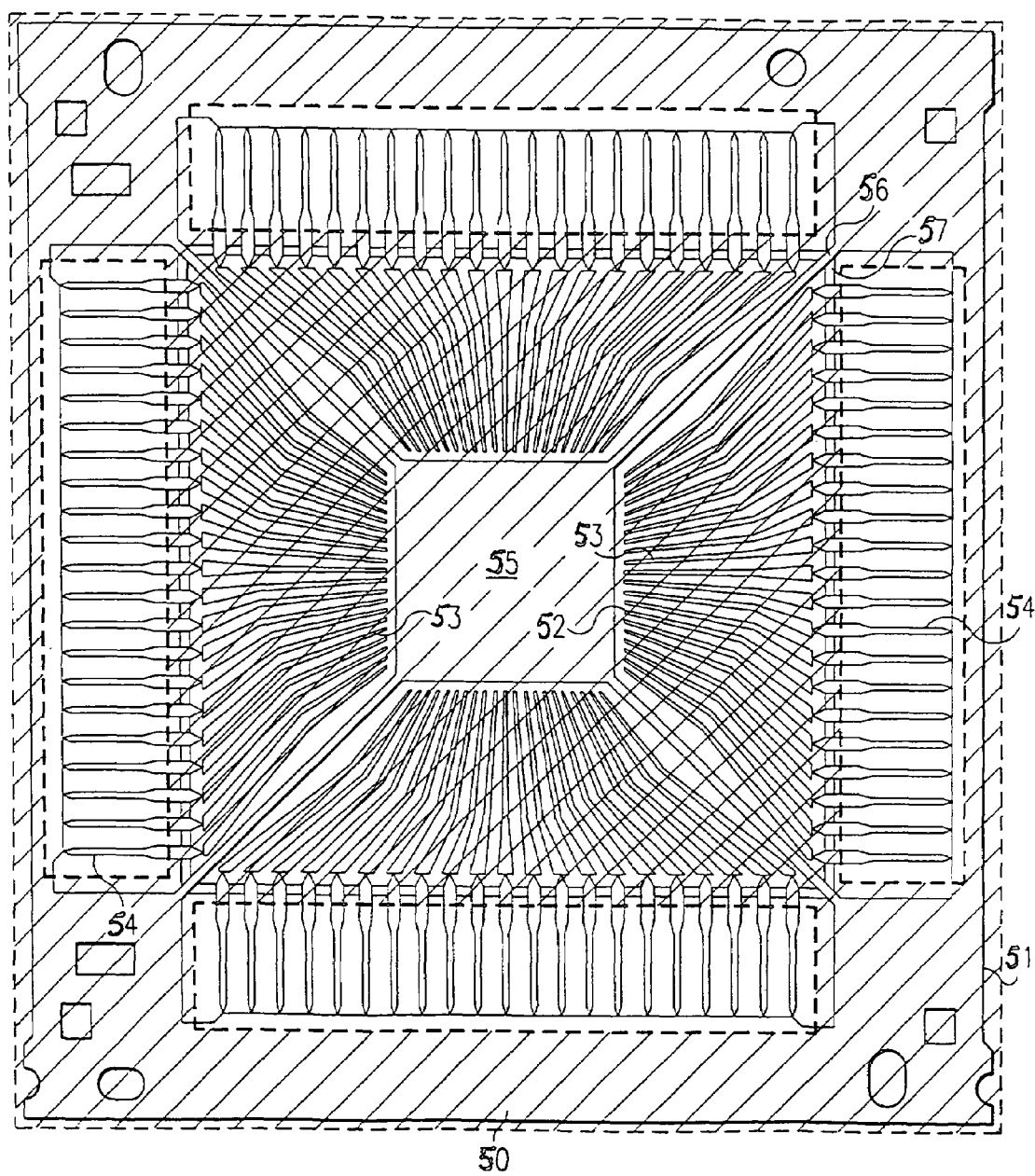
FIG. 5 is a simplified top view of an example of a leadframe unit for semiconductor devices, delineating the masking needed in the pure tin solder plating fabrication method according to the invention.

It is an important aspect of the present invention to deposit the tin layer selectively onto the leadframe using an inexpensive, temporary masking step, which leaves only those leadframe portions exposed which are intended to receive the solder layer. An example of the extent of such masking is depicted in FIG. 5, which shows a single leadframe unit from a continuous strip, for a typical semiconductor Quad Flat Pak device. The temporarily masked parts of the leadframe unit are shaded and the exposed parts are unshaded. The exposed parts include the second ends 54 of the plurality of lead segments 53, remote from chip mount pad 55.

As defined herein, each lead segment 53 has a first end 52 near the chip mount pad 55 and a second end 54 remote from chip mount pad 55. In the example of FIG. 5, the leadframe unit has 84 lead segments 53, since it is designed for a plastic 84-lead Quad Flat Pak chip carrier.

Further, the temporarily masked portions of the leadframe include carrier rails 50, outer leadframe 51, portions of the plurality of support members 56, which extend from carrier rail 50 toward chip mount pad 55, and dam bar 57. In the example of FIG. 5, the device has 4 support members 56. As described above, there are several methods to selectively deposit metals from solution onto a continuous strip.

There are numerous advantages of the tin pre-plating process of the invention compared to the customary post-mold plating process of the existing technology. In the post-mold plating process, the plastic encapsulated device is exposed to a plating solution as a wet chemical process, which may dissolve some plastic and compromise the integrity of the device. Further, this post-mold plating step typically has to be performed at a semiconductor assembly site; it lengthens the product cycle time. The post-mold plating step adds cost and cycle time to the assembly process, and does not offer a cost-free opportunity to anneal the electro-deposited tin. Adding the nickel underplate would require a separate plating line, which is not available in post-mold plating facilities.

The process of performing the nickel, palladium, and tin plating in the leadframe manufacturer's factory is preferred because these factories are equipped with the appropriate plating facilities, waste treatment, process water, expertise and personnel. Further, quality controls such as layer thickness are performed at a point in the process flow where the intrinsic value of the part is low (no I/C chip has yet been added) and more easily correctable. At the leadframe manufacturer, the nickel and palladium plating can be done in a single, high speed step, and the tin plating, including the necessary nickel activation, can be performed in a second pass of the leadframe. In addition, the nickel surface can be roughened to ensure excellent mold compound adhesion. According to the invention, the important tin annealing step can be obtained without additional cost as a side-benefit of the molding compound curing step.

Figure 6:
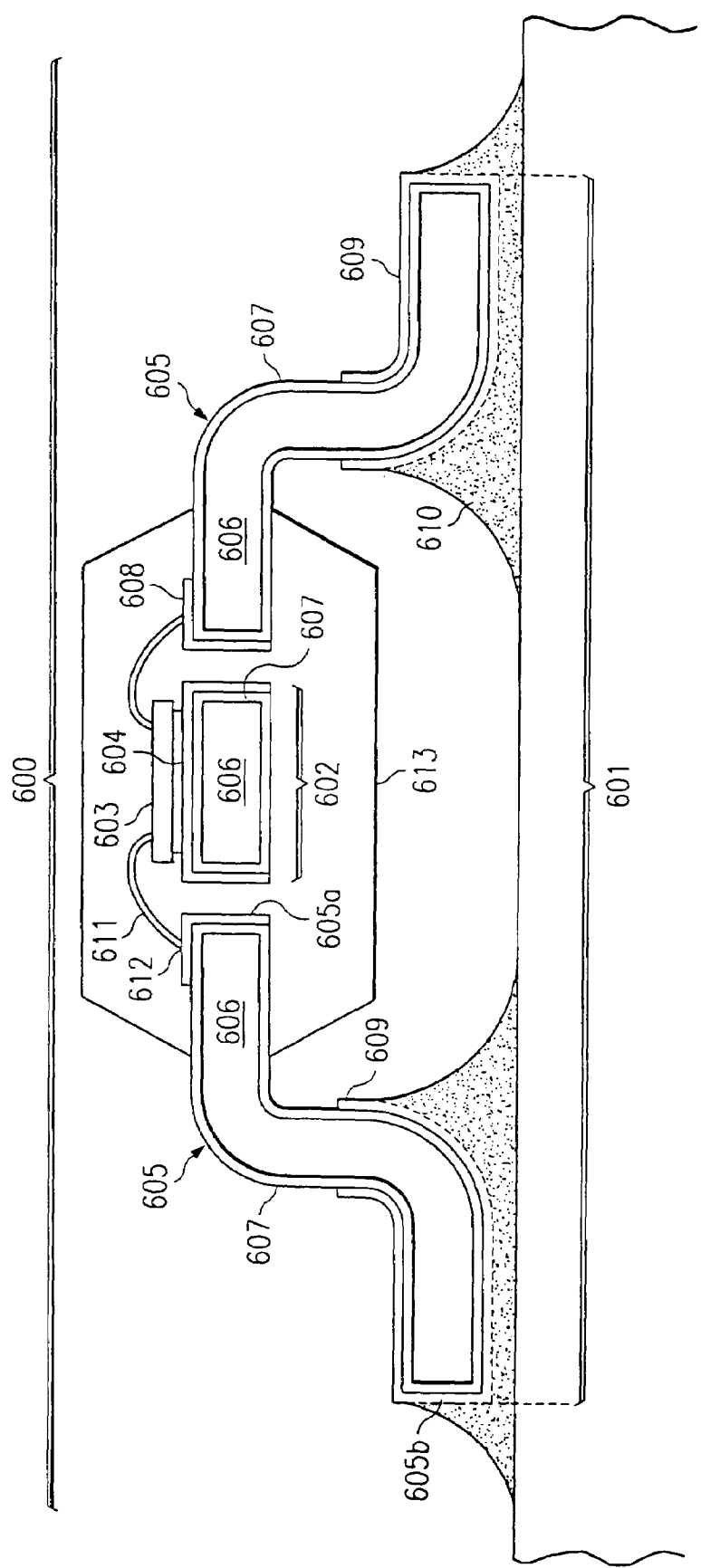
FIG. 6 is a schematic and simplified cross sectional view of a packaged semiconductor device having a leadframe according to the invention, tin solder assembled on a substrate.

An example of formed outer leads of a finished molded package is illustrated in FIG. 6. In the schematic cross section of FIG. 6, the copper or copper alloy leadframe 601 of the invention is shown as applied in the assembly of a semiconductor package generally designated 600. Leadframe 601 has a chip mount pad 602 onto which an IC chip 603 is attached using adhesive material 604 (typically an epoxy or polyimide which has to undergo polymerization). Leadframe 601 further has a plurality of lead segments 605. These lead segments have a first end 605a near the chip mount pad 602 and their second end 605b remote from mount pad 602.

As shown in FIG. 6 schematically, leadframe 601 comprises base 606 made of copper or copper alloy. On the surface of this copper is a sequence of layers, described in detail in FIG. 4. Closest to the copper is a first layer 607 of nickel. This layer is followed by a spot-plated layer 608 of palladium, and a spot-plated layer 609 of tin. This tin layer 609 is incorporated into the meniscus of the bulk solder 610 in the process of surface mounting device 600 onto a substrate or board.

In FIG. 6, bonding wires 611 have stitches 612 welded to the palladium surface 608 of the first ends 605a of leadframe segments 605. The bonding wires are selected from a group consisting of gold, copper, aluminum, and alloys thereof. Any of these metals provide reliable welds to the layered leadframes of the invention.

As shown in FIG. 6, the second ends 605b of segments 605 are suitable for bending and forming due to the ductility of the copper base and the plated nickel layer. In general, copper leads plated with the tin of the invention have better trim/form performance than leads plated with the traditional lead/tin alloy due to improved ductility. Using this malleable characteristic, segments 605 may be formed in any shape required for surface mounting or any other technique of board attach of the semiconductor devices. The bending of the segments does not diminish the corrosion protection of the second segment ends 605b. For example, FIG. 6 indicates a so-called "gull wing shape" of segments 605. This shape is widely used for IC packages in the so-called "small outline" configuration, as illustrated in FIG. 6.

The tin spot-plated copper leadframe of the invention provides for easy and reliable solder attachment to boards or other parts of the formed leadframe segments. In FIG. 6, solder attach material 610 comprises a solder paste or wave; as pointed out above, this paste may dissolve the plated tin layer (indicated by the dashed lines in FIG. 6), resulting in good wetting characteristics to the plated nickel surface of the copper leadframe.

In FIG. 6, molding compound 613 encapsulates the mounted chip 603, bonding wires 611 and the first ends 605a of the lead segments 605. The second, remote ends 605b of the segments are not included in the molded package; they remain exposed for solder attachment. Typically, the encapsulation material 613 is selected from a group consisting of epoxy-based molding compounds suitable for adhesion to the leadframe surfaces. For palladium, excellent adhesion characteristics to molding compounds can be achieved, preventing package delamination, moisture ingress and corrosion.

In regard to corrosion, it should be pointed out that copper creep corrosion is a function of the nobility of the exposed surface. In the present invention, the surface of the leadframe has nickel, nickel oxide, and tin on it. This will present copper creep corrosion as compared to a surface with pure palladium, and the performance in the mixed flowing gas corrosion tests is accordingly better.

Leadframes fabricated with the plated layers according to the invention also have an advantage for visual inspection. The tin as well as the palladium layers can be seen on the surface of the nickel-plated leadframes by cursory visual control—a low cost benefit for manufacturing process control.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the designs, cover areas and fabrication methods of the tin layer and of the palladium layer may be modified to suit specific leadframe or substrate needs. It is therefore intended that the appended claims encompass any such modifications or embodiments.

We claim:

1. A method for forming a leadframe for use in the assembly of integrated circuit devices, comprising:
   providing a base metal structure;
   forming a nickel layer on the metal structure;
   forming a matte, coarse grain, tin solder layer on the nickel layer selectively, covering an area of said leadframe for attaching a integrated circuit chip; and
   forming a palladium or silver layer selectively, covering an area of said leadframe suitable for attaching a bonding wire.

2. The method in claim 1 wherein the base metal structure includes copper, copper alloy, aluminum, iron-nickel alloy, or invar.

3. The method in claim 1 wherein said tin solder has a reflow temperature of 232° C.

4. The method in claim 1 wherein the solder layer has a thickness in the range from about 4.0 to 6.0 μm.

5. The method in claim 1 wherein said palladium or silver layer has a thickness in the range from about 20 to 60 nm.

6. A method for forming a leadframe for use with integrated circuit chips comprising:
   providing a base metal structure having a plated layer of nickel fully covering said base metal;
   forming a layer of matte, coarse grain, pure tin on said nickel layer selectively, covering
   an area of said leadframe suitable for attaching a circuit chip; and
   forming a layer of palladium or silver on said nickel layer selectively, covering an area of said leadframe suitable for attaching a bonding wire.

7. A method for forming a semiconductor device comprising:
   providing a leadframe including a chip-mount pad and a lead segment having a first end
   near said mount pad and a second end remote from said mount pad;
   forming a nickel layer over said leadframe;
   forming a layer of palladium on said nickel layer selectively, covering said first end of said lead segment;
   attaching an integrated circuit chip to said mount pad; and
   applying a layer of matte, coarse grain, pure tin solder selectively, covering said second end of said lead segment.

8. The method in claim 7 further comprising bending the lead segment suitable for solder attachment.

* * * * *